(12) United States Patent
Waite et al.

(10) Patent No.: US 7,179,745 B1
(45) Date of Patent: Feb. 20, 2007

(54) METHOD FOR OFFSETTING A SILICIDE PROCESS FROM A GATE ELECTRODE OF A SEMICONDUCTOR DEVICE

(75) Inventors: Andrew M. Waite, Wappingers Falls, NY (US); Jon D. Cheek, Wallkill, NY (US); David Brown, Pleasant Valley, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 173 days.

(21) Appl. No.: 10/860,100

(22) Filed: Jun. 4, 2004

(51) Int. Cl.
*H01L 21/311* (2006.01)
(52) U.S. Cl. .................. 438/694; 438/706; 438/745
(58) Field of Classification Search ............... 438/694, 438/706, 745
See application file for complete search history.

(56) References Cited

U.S. PATENT DOCUMENTS 6,121,139 A * 9/2000 Chang et al. ............... 438/683
6,136,705 A * 10/2000 Blair ........................... 438/682
6,255,227 B1 * 7/2001 Donaton et al. ............ 438/745
6,329,695 B1 * 12/2001 Duane et al. ............... 257/408

* cited by examiner

*Primary Examiner*—Nadine Norton
*Assistant Examiner*—Lynette T. Umez-Eronini

(57) ABSTRACT

A method for offsetting silicide on a semiconductor device having a polysilicon gate electrode, source and drain regions in a substrate, and source and drain extensions in the substrate, employs a titanium nitride sidewall spacer on the sidewalls of the polysilicon gate electrode. The titanium nitride sidewall spacer prevents silicide growth on top of the source and drain extensions during a salicidation process. The titanium nitride sidewall spacers are then removed by an etching process that does not etch the silicide regions formed in the source and drain regions and the polysilicon gate electrode. Following removal of the titanium nitride sidewall spacers, a low k interlevel dielectric layer or a stress liner may be deposited on top of the devices to enhance device performance.

18 Claims, 5 Drawing Sheets

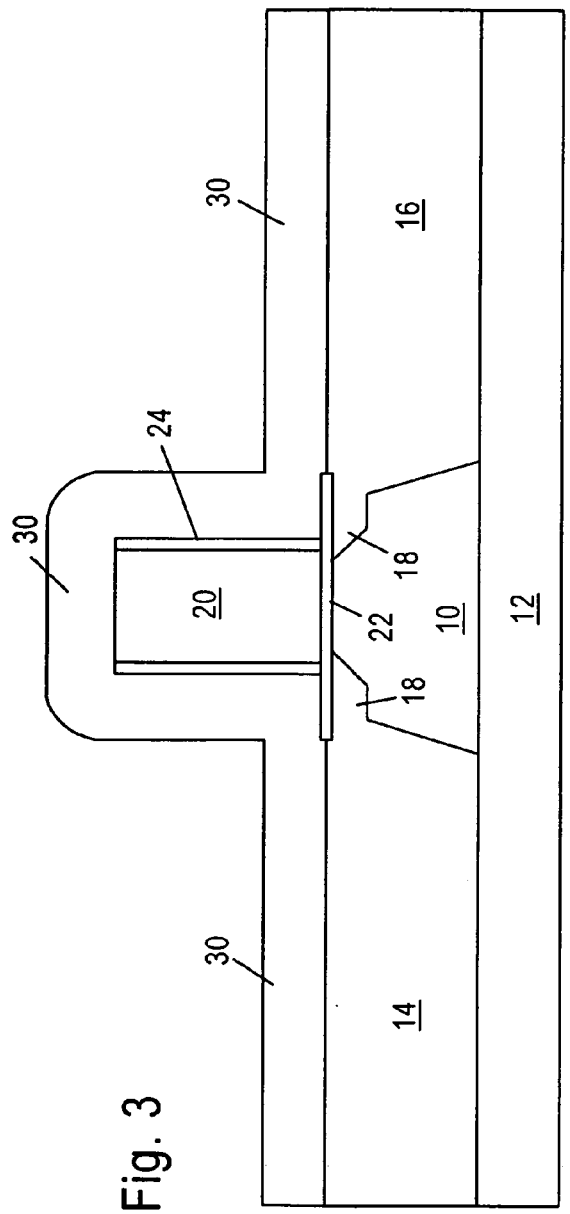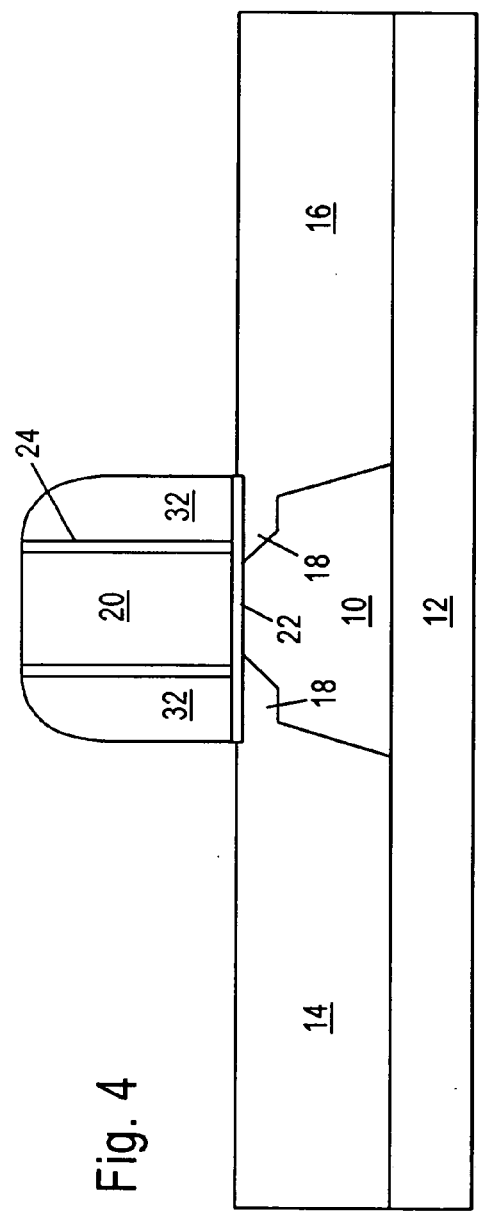

METHOD FOR OFFSETTING A SILICIDE PROCESS FROM A GATE ELECTRODE OF A SEMICONDUCTOR DEVICE

FIELD OF THE INVENTION

The present invention relates to the field of manufacturing semiconductor devices, and more particularly, to the formation of silicide on semiconductor devices.

BACKGROUND OF THE INVENTION

Over the last few decades, the semiconductor industry has undergone a revolution by scaling of semiconductor devices to fabricate smaller, more highly integrated electronic circuits. The most common semiconductor technology presently used is silicon-based. A large variety of semiconductor devices have been manufactured having various applications in numerous disciplines. One silicon-based semiconductor device is the metal-oxide-semiconductor field effect transistor (MOSFET). The MOSFET transistor is one of the basic building blocks of most modern electronic circuits. Importantly, these electronic circuits realize improved performance and lower costs, as the performance of the MOSFET transistor is increased and as manufacturing costs are reduced.

A type of device, commonly referred to as a MOS field-effect-transistor (MOSFET), includes a channel region formed in a silicon film or semiconductor substrate beneath the gate area or electrode and between the source and drain regions. The channel is typically doped with a dopant having a conductivity type opposite to that of the source/drain regions. The gate electrode is generally separated from the substrate by an insulating layer, typically silicon diode or silicon oxynitride. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner, an electric field is used to control the current flow through the channel region.

The semiconductor industry is continually striving to improve the performance of MOSFET devices. Performance improvements have been obtained by the use of a salicide process (self-aligned-silicide). This process has become a mainstay in semiconductor processing because the process produces contacts having low-ohmic resistance and the contacts are formed using a self-aligned process.

A salicide process involves depositing a refractory metal across the semiconductor topography. After the refractory metal is deposited and subjected to a high enough temperature, a chemical reaction occurs wherever the refractory metal is in contact with a region of bare silicon or polycrystalline silicon. The refractory metal does not react with materials present on a part processed wafer, such as silicon nitride or silicon dioxide. In this manner, metal silicide may be formed exclusively upon the source/drain regions and the upper surface of a polysilicon gate conductor interposed between the source/drain regions. Silicide formation formed upon a polysilicon gate is generally referred to as a polycide gate, which significantly reduces the resistance of the gate structure, as compared to previously used polysilicon gate structures. Silicide formation on the source/drain regions also significantly reduces the resistance of the contacts to the source/drain regions. Any unreacted metal is removed after formation of the silicide.

When forming the silicide, it is important to prevent the silicide from reacting with the sidewalls of the polysilicon gate electrode, so as to prevent shorting between the source or drain and the gate. This is normally accomplished by a pair of sidewall spacers formed on the sidewalls of the gate electrode. The sidewall spacers are typically made of silicon nitride or silicon dioxide and are left on the wafer after manufacture. The refractory metal that forms the silicide when reacted with silicon does not react with the silicon nitride or silicon dioxide sidewall spacers during the annealing process.

In certain processing schemes, it may be advantageous to remove the conventional sidewall spacers to allow other structural arrangements that increase device performance. For example, removing the sidewall spacers containing silicon dioxide or silicon nitride and forming an interlayer dielectric (ILD) consisting of low k dielectric material will enhance device performance, by reducing the parasitic Miller or overlap capacitance between the gate and source, and between the gate and drain. However, the wet and dry etch processes that are conventionally used to strip silicon dioxide or silicon nitride remove some or all of the silicide. Additionally, a wet process to remove a silicon dioxide spacer would also remove some of the shallow trench isolation (STI) oxide typically employed in the semiconductor arrangements. This undesirable etching of the silicide when removing the silicon dioxide or silicon nitride spacers limits the availability of removing these spacers to enhance device performance.

SUMMARY OF THE INVENTION

There is a need for a method of offsetting a silicide layer from a polysilicon gate electrode in a manner that allows for the removal of the spacers without attacking the previously formed silicide on the source and drain regions and on the polysilicon gate electrodes.

This and other needs are met by embodiments of the present invention which provide a method of forming silicide on a semiconductor device having a polysilicon gate electrode, source and drain regions in a substrate, and source and drain extensions in the substrate. The method comprises the sequential steps of forming sidewall spacers consisting of a first material on the sides of the polysilicon gate electrodes and over the source and drain extensions. A refractory metal layer is deposited across the wafer, on the sidewall spacers, the polysilicon gate electrodes, the field oxide and the substrate or SOI silicon. Annealing is performed to form silicide in the source and drain regions and the polysilicon gate electrodes, the sidewall spacers preventing salicidation of the source and drain extensions. The unreacted metal from the silicide process and the first material forming the sidewall spacers is then removed employing an etchant that is selective to the refractory metal and the first material and does not substantially etch the silicide in the source and drain regions and the polysilicon gate electrode.

In certain embodiments of the invention, the first material is titanium nitride (TiN), which can be removed by selective etching with a sulphuric peroxide mixture (SPM), for example. The removal of the titanium nitride spacers, which are used to offset the silicide formed in the source and drain regions from the polysilicon gate electrode, may be accomplished without etching the previously formed silicide regions. After removal of the sidewall spacers, further device enhancements may be created, such as the formation of a low k ILD, or the formation of a stress liner that is not separated from the MOSFET gate electrode by a sidewall spacer. It is important to reduce the distance between the stress liner and the channel of the MOSFET device in order to impart more stress from the stress liner to the channel of the MOSFET. In this way extra mechanical stress, that enhances the mobility of charge carriers (electrons and holes) in the channel of the MOSFETs, can be exerted on the MOSFET channel.

The earlier stated needs are also met by other aspects of the present invention that include a method of forming a semiconductor device, comprising the steps of forming a gate electrode on a substrate and forming source and drain extensions in the substrate. Source and drain regions are formed in the substrate. Titanium nitride sidewall spacers are formed on the sides of the gate electrode and over the source and drain extensions. The source and drain regions are salicided, with the titanium nitride sidewall spacers preventing salicidation of the source and drain extensions. The titanium nitride sidewalls spacers are then removed.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 3 shows the structure of FIG. 2 following the deposition of a sidewall spacer layer in accordance with embodiments of the present invention.

FIG. 4 depicts the structure of FIG. 3 following the formation of sidewall spacers from the sidewall spacer layer, in accordance with embodiments of the present invention.

DETAILED DESCRIPTION OF THE INVENTION

The present invention addresses and solves problems related to the formation of silicide that is offset from a polysilicon gate electrode, but in a manner that provides a disposable spacer to offset a silicide from a polysilicon gate electrode that can be removed later in the process without etching the silicide regions previously formed by a salicide process. This is achieved, in part, by the present invention which provides for a spacer, such as a titanium nitride sidewall spacer, formed on the sidewalls of the polysilicon gate electrode following the formation of source and drain extensions and source and drain regions, and the removal of a conventional sidewall spacer made of silicon nitride or silicon dioxide, for example. Following the formation of silicide by a salicide process, the titanium nitride sidewall spacers may be readily removed by an etchant, such as sulphuric peroxide mixture, that does not etch the silicide nor silicon dioxide in the STI regions. With the sidewall spacers thus removed, and the silicide preserved, device performance may be enhanced by the formation of an interlevel dielectric layer of low k material, or the formation of a stress liner that is closer to the polysilicion gate electrode than would be the case if the first silicon nitride or silicon diode spacer were still in place, in accordance with certain embodiments of the invention.

Figure 1:
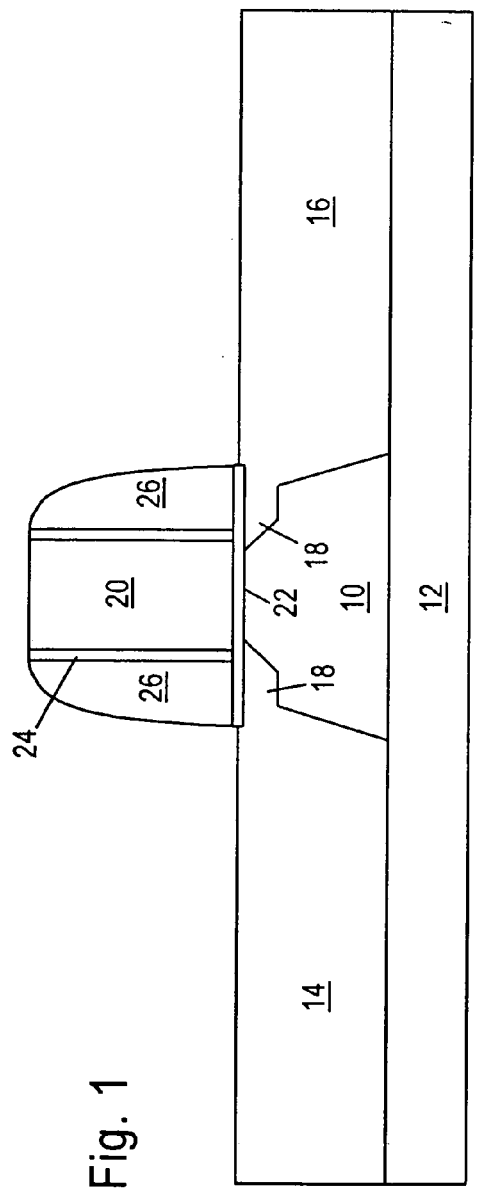
FIG. 1 depicts a schematic, cross-sectional view of a portion of a semiconductor wafer during one phase of manufacture in accordance with embodiments of the present invention.

FIG. 1 depicts a schematic, cross-sectional view of a portion of a semiconductor wafer in accordance with embodiments of the present invention. The semiconductor device depicted in FIG. 1 is formed on a silicon-on-insulator (SOI) arrangement, for example, although the invention is not limited in this respect. A polysilicon gate electrode 20 is formed on a substrate 10 comprising a buried oxide layer 12 and a silicon layer 14, 10 and 16 formed on the buried oxide layer 12. Source region 14 and drain region 16, as well as source and drain extensions 18, are formed in a conventional manner. A gate oxide 22 is provided between the polysilicon gate electrode 20 and the silicon layer 14, 10 and 16. Further, a reoxidation oxide, offset spacer and oxide liner 24 are formed on the sides of the polysilicon gate electrode 20. Disposable sidewall spacers 26 are formed on the offset spacer and reoxidation oxide and oxide liner 24. The disposable sidewall spacers 26 may comprise a conventional sidewall spacer material, such as silicon nitride or silicon dioxide, for example.

The formation of the arrangement of FIG. 1 may be achieved in a conventional manner. For example, following the formation of the polysilicon gate electrode 20 and the reoxidiation oxide, offset spacer and oxide liner 24, a source and drain extension implant process may be performed to create the source and drain extensions 18. A sidewall spacer layer is then formed over the silicon layer 14 and 16 as well as source and drain extensions 18, and gate electrode 20 and then etched by a reactive ion etch, for example, to form the disposable sidewall spacers 26. Following the formation of the sidewall spacers 26, the source 14 and drain 16 regions are created by ion implantation, for example, using the disposable sidewall spacers 26 and the polysilicon gate electrode 20 as a mask. Following the creation of the source and drain extensions 18 and the source and drain regions 14, 16, a rapid thermal processing (RTP) is performed to activate the source/drain dopants. A conventional RTP process may be performed to activate the source/drain dopants.

Figure 2:
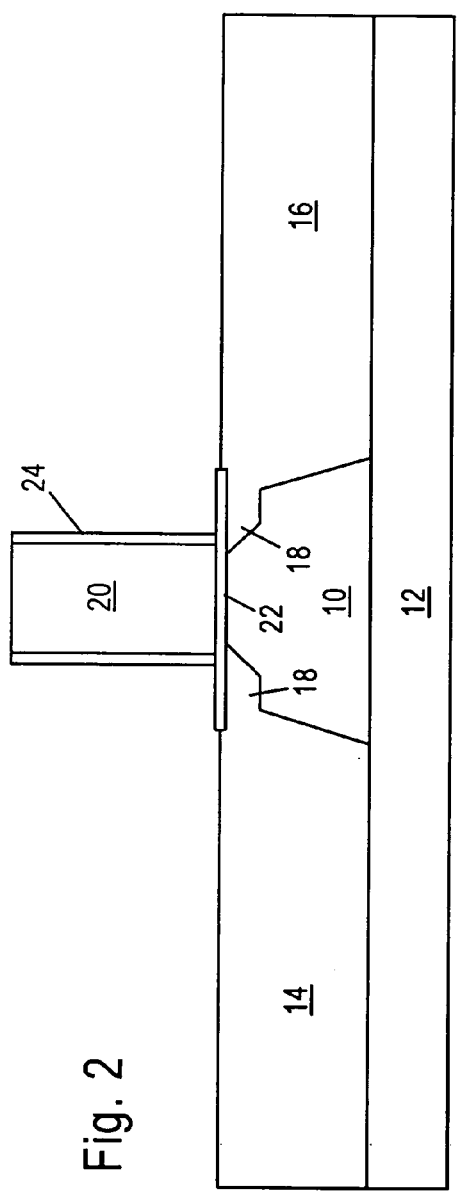
FIG. 2 depicts the structure of FIG. 1 after the disposable sidewall spacers are removed in accordance with embodiments of the present invention.

In FIG. 2, the disposable sidewall spacers 26 have been removed. Assuming the sidewall spacers 26 are made of silicon nitride, for example, a wet etchant that may be employed is hot phosphoric acid. However, since hot phosphoric acid is an aggressive etchant, dry etching methods including using a fluorocarbon (tetrafluoromethane) and oxygen or hydrogen, may be employed. Alternatively, if the disposable sidewall spacers 26 are made of silicon dioxide, for example, a wet etchant, such as HF mixed with water or ammonium fluoride and water may be employed, otherwise known as a buffered oxide etch. Such an etch may also contain a wetting agent. Alternatively, a dry etchant for silicon dioxide is a reactive ion etch with fluorocarbon plasma.

During the processing to remove the disposable sidewall spacers 26, there is no silicide on the wafer at this stage. Hence, the spacer removal etch may be performed without concern of attack on the silicide.

FIG. 3 depicts the structure of FIG. 2 following the forming of a layer 30 on the silicon layer 14, 16 and the polysilicon gate electrode 20. An exemplary material for the layer 30 is titanium nitride (TiN). The reason for using titanium nitride 30, as an exemplary material, in the layer 30 will become more apparent in the following description. A conventional method of depositing the titanium nitride in the layer 30, such as chemical vapor deposition (CVD) or other methodology, is employed.

Sidewall spacers 32 are formed by the dry etching of the layer 30, the results of which are depicted in FIG. 4. The sidewall spacers 32, which may be titanium nitride sidewall spacers in exemplary embodiments of the invention, cover the source and drain extensions 18. A conventional anisotropic etch may be employed to create the sidewall spacers 32. An etchant that may be used during the reactive ion etch or other anisotropic etch of titanium nitride is a Chlorine/Nitrogen/Oxygen chemistry mixture. The etch removes the horizontal surfaces of the metal layer 30, including the metal from the top of the polysilicon gate electrode 20. This serves to expose the surfaces of the source region 14 and the drain region 16, and the top of the polysilicon gate electrode 20, in preparation for the salicidation process.

Figure 5:
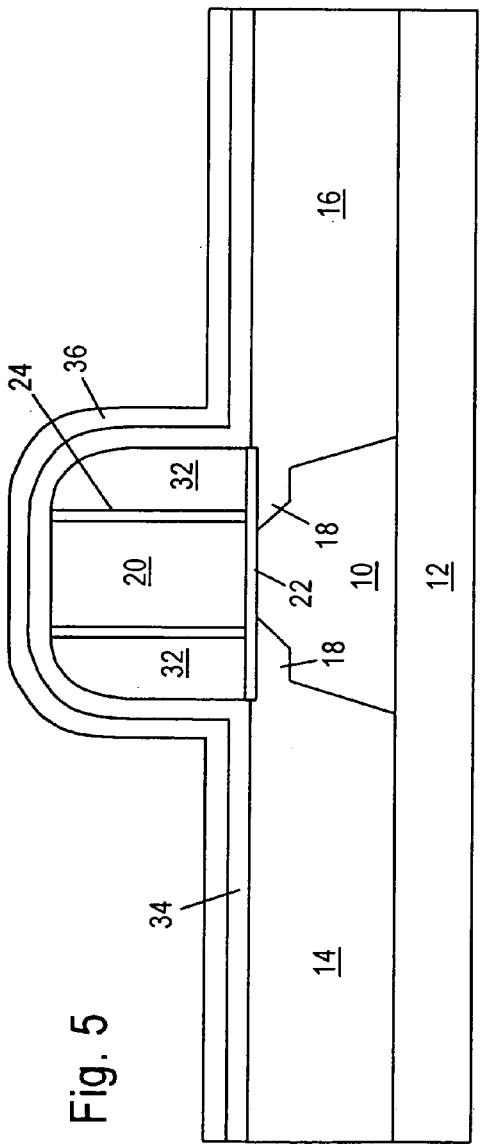
FIG. 5 shows the structure of FIG. 4 following the deposition of a refractory metal layer and a cap layer in accordance with embodiments of the present invention.

In FIG. 5, a refractory metal layer 34 is conformably deposited, followed by a cap layer 36. Conventional techniques for depositing the refractory metal layer 34 and the cap layer 36 may be employed, such as CVD. Exemplary materials for the refractory metal include nickel, cobalt, titanium, platinum, etc. The thickness of the refractory metal layer 34 may be selected to form a desired thickness of silicide within the source and drain regions 14, 16 and in the polysilicon gate electrode 20.

The cap layer 36 may be made of titanium nitride, for example. The cap layer is also conformably deposited over the refractory metal layer 34. A cap layer is added in some salicidation processes to prevent any residual oxygen in an RTP furnace from reacting with the underlying metal. However, many salicidation processes do not use such a cap, and instead rely on careful purging of the furnace to prevent the oxygen from reacting with the metal. Hence, in certain embodiments of the invention, the cap layer 36 is not employed.

Figure 6:
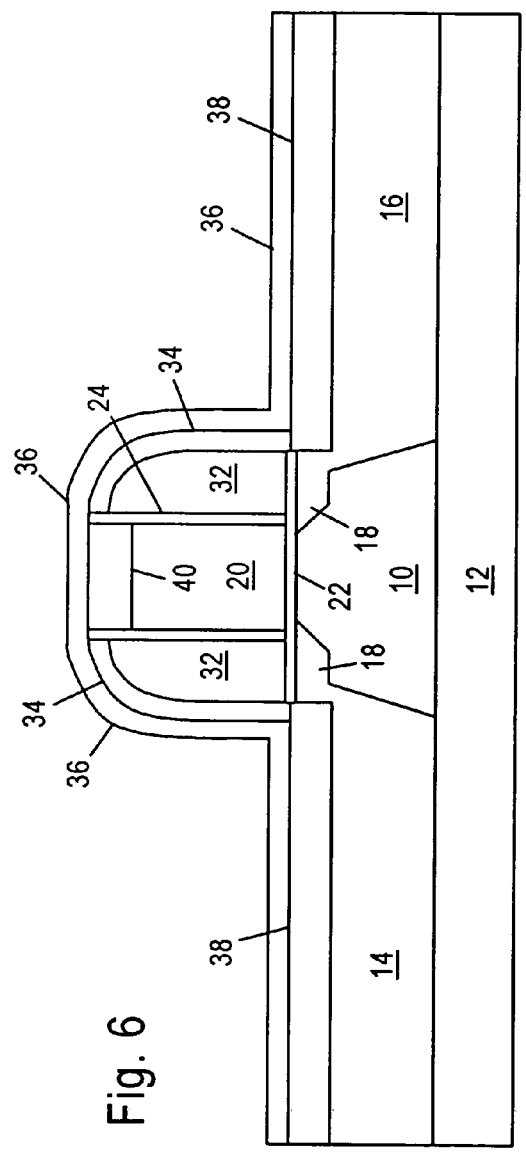
FIG. 6 shows the structure of FIG. 5 after an annealing step to form silicide regions in the source and drain regions and the gate electrode, in accordance with embodiments of the present invention.

In FIG. 6, the wafer is heated, such as by rapid thermal annealing (RTA), to react the metal in the refractory metal layer 34 with the silicon in the source and drain regions 14, 16 and in the polysilicon gate electrode 20. This creates silicide regions 38 in the source and drain regions 14, 16 and a silicide region 40 in the polysilicon gate electrode 20. Conventional silicide process parameters may be employed, depending upon the particular metal in the refractory metal layer 34. During the salicidation process, the sidewall spacers 32 and the liner oxide 24 prevent salicidation of the source and drain extensions 18. Hence, the source and drain silicide regions 38 are effectively separated from the polysilicon gate electrode 20. However, as stated earlier, it is desirable to provide an arrangement in which the sidewall spacers employed in separating the source and drain are removed.

Figure 7:
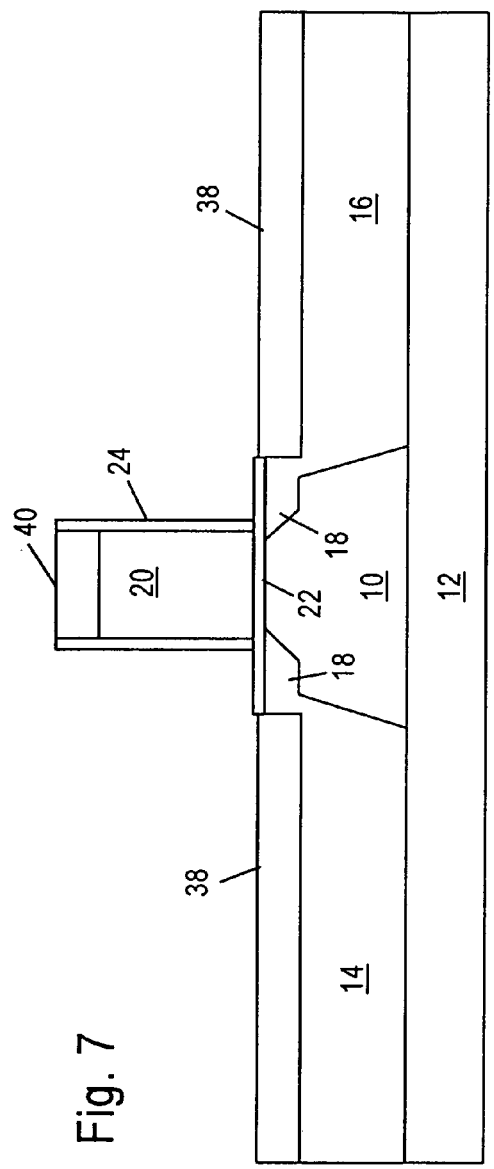
FIG. 7 depicts the structure of FIG. 6 following the removal of the sidewall spacers in accordance with embodiments of the present invention.

FIG. 7 depicts the structure of FIG. 6 following the removal of the cap layer 36, any remaining unreacted metal from the refractory metal layer 34, and the sidewall spacers 32. This may all be performed in a single etching stage. A conventional etch to remove a disposable spacer, such as a silicon nitride spacer or a silicon dioxide spacer after salicidation, would partially or fully etch the silicide in the silicide regions 38 and 40. However, the use of a sidewall spacer 32 made of titanium nitride, for example, allows the sidewall spacer 32 to be completely removed in an etch that does not etch the silicide, nor the silicon dioxide contained in a liner or shallow trench isolation region. An etchant that removes the titanium nitride and the unreacted refractory metal, but does not attack the silicide, is sulphuric peroxide mixture (SPM), for example. Hence by this method, the spacers 32 are removed from the polysilicon gate electrode 40 while preserving the integrity of the silicide regions 38 and 40. The spacers 32 are thus removed by a selective etch that is selective to the material in the spacers 32 and do not substantially etch the silicide in the source and drain regions 14, 16 and in the polysilicon gate electrode 20. As exemplary materials, titanium nitride for the disposable spacer 32 and the etchant of sulphuric peroxide mixture are suitable, although other materials and etchants may be employed without departing from the scope of the present invention.

Figure 8:
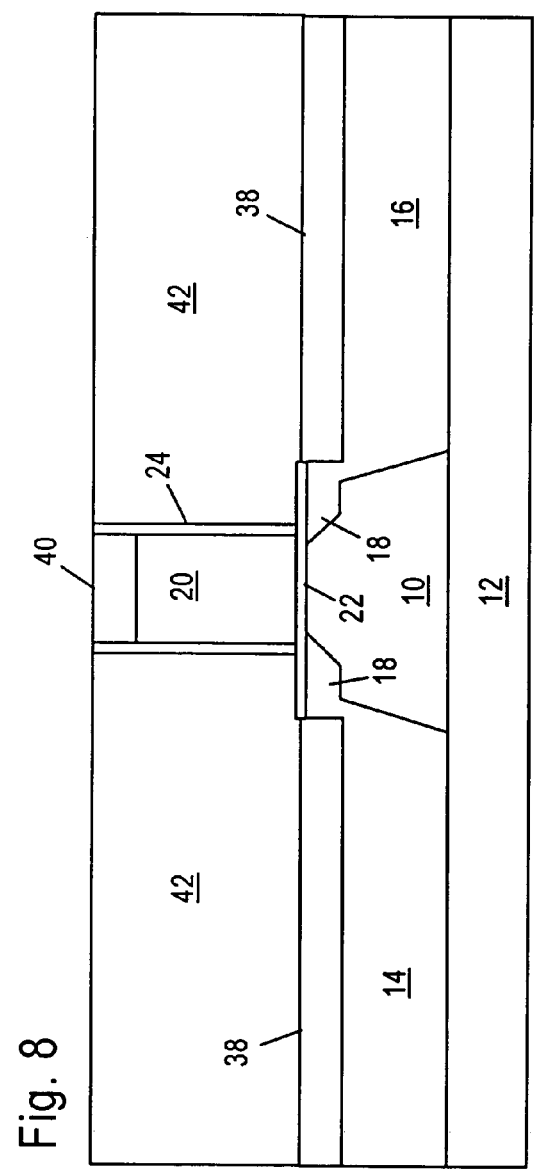
FIG. 8 depicts the structure of FIG. 7 following the formation of an ILD layer in accordance with embodiments of the present invention.

In FIG. 8, a low k interlevel dielectric layer 42 has been formed. The removal of higher k dielectric materials, such as silicon nitride or silicon dioxide, from the arrangement enhances the performance of the device. The replacement of the higher k sidewall spacers with a low k ILD 42 reduces overlap capacity between source and gate and between gate and drain. This allows faster circuits to be realized.

Figure 9:
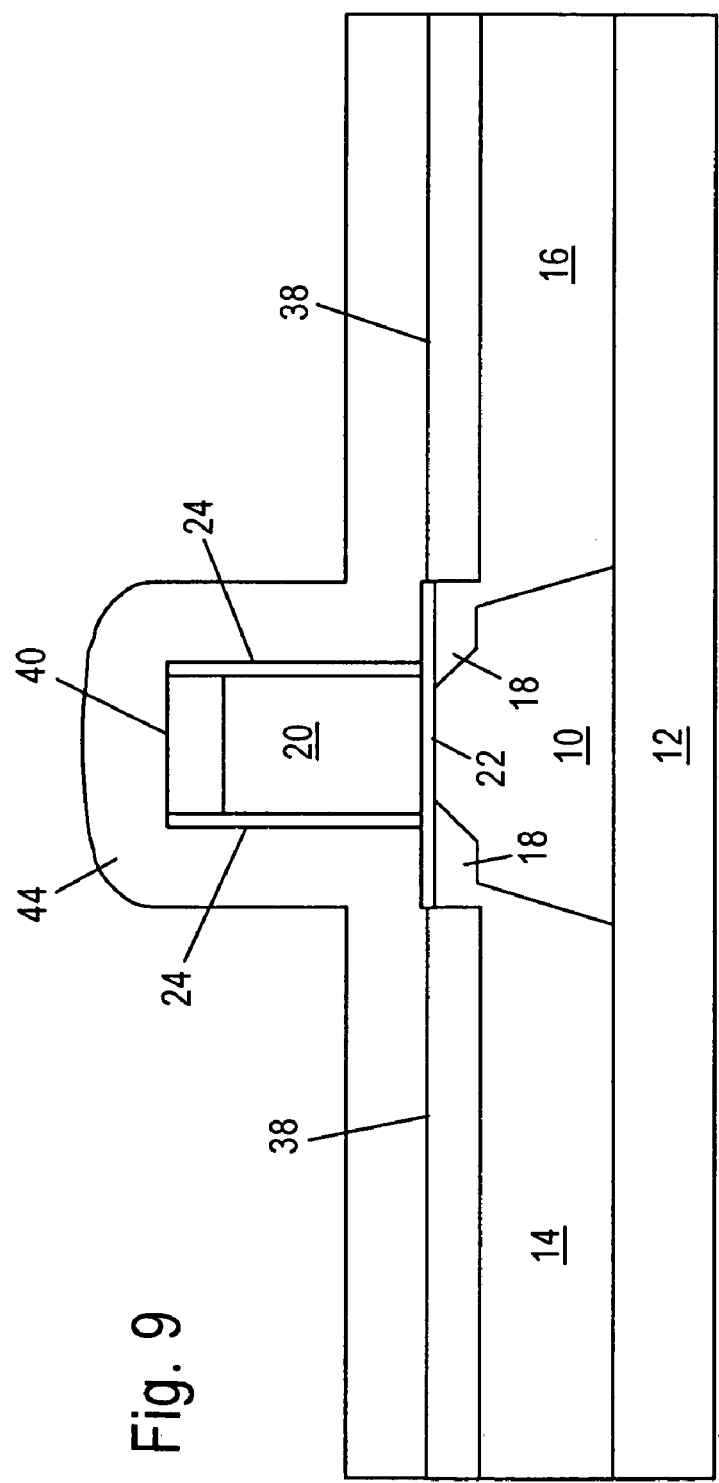
FIG. 9 depicts the structure of FIG. 7 following the formation of a stress liner, in accordance with certain embodiments of the present invention.

Similarly, in FIG. 9, an alternate embodiment of the invention is depicted in which a stress liner 44 is formed. For example, the stress liner 44 may comprise silicon nitride, and be deposited to an exemplary thickness of approximately 75 nm. The deposition conditions are such that the material of the stress liner 44 induce compressive or tensile stress in the silicon channel of the semiconductor device. The deposition of the stress liner 44 on top of the device after the spacers have been removed allows extra stress from the stress liner 44 to be transmitted to the silicon device. This enhances nMOSFET and pMOSFET device performance.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming silicide on a semiconductor device having a polysilicon gate electrode, source and drain regions in a substrate, and source and drain extensions in the substrate, comprising the sequential steps of:
    forming sidewall spacers consisting of a first material on the polysilicon gate electrode and over the source and drain extensions;
    forming a refractory metal layer on the sidewall spacers, the polysilicon gate electrode, and the substrate;
    annealing to form silicide in the source and drain regions and the polysilicon gate electrode, the sidewall spacers preventing salicidation of the source and drain extensions; and
    removing the sidewall spacers employing an etchant that is selective to the first material and does not substantially etch the silicide in the source and drain regions and the polysilicon gate electrode.

2. The method of claim 1, wherein the first material is titanium nitride (TiN).

3. The method of claim 2, wherein the etchant is sulphuric peroxide mixture (SPM).

4. The method of claim 3, further comprising forming a cap layer on the refractory metal layer prior to the step of annealing.

5. The method of claim 4, wherein the cap layer consists of titanium nitride.

6. The method of claim 3, further comprising: forming an oxide layer and offset spacers on the polysilicon gate electrode; forming disposable sidewall spacers consisting of a second material on the oxide liner and offset spacers; and implanting dopants into the substrate to form the source and drain regions, prior to the step of forming sidewall spacers consisting of a first material on the polysilicon gate electrode, wherein the second material is different from the first material.

7. The method of claim 6, wherein the second material is silicon nitride or silicon dioxide.

8. The method of claim 7, further comprising removing the disposable sidewall spacers prior to the step of forming sidewall spacers consisting of a first material.

9. The method of claim 3, further comprising forming a stress liner on the polysilicon gate electrode and the substrate after the sidewall spacers are removed.

10. The method of claim 3, further comprising forming low k sidewall spacers on the polysilicon gate electrode after the sidewall spacers are removed.

11. A method of forming a semiconductor device, comprising the steps:
   forming a gate electrode on a substrate;
   forming source and drain extensions in the substrate:
   forming source and drain regions in the substrate;
   forming titanium nitride (TiN) sidewall spacers on the gate electrode and over the source and drain regions;
   saliciding the source and drain regions, the TiN sidewall spacers preventing salicidation of the source and drain extensions; and
   removing the TiN sidewall spacers.

12. The method of claim 11, wherein the step of removing the TiN sidewall spacers includes etching the TiN sidewall spacers with an etchant that does not substantially etch silicide.

13. The method of claim 12, wherein the etchant is sulphuric peroxide mixture.

14. The method of claim 12, further comprising forming a stress liner on the gate electrode and the substrate after the TiN sidewall spacers are removed.

15. The method of claim 12, further comprising forming low k sidewall spacers on the gate electrode after the sidewall spacers are removed.

16. The method of claim 12, further comprising:
   forming an oxide liner and offset spacers on the gate electrode;
   forming disposable sidewall spacers on the oxide liner and offset spacers; and
   implanting dopants into the substrate to form the source and drain regions, prior to the step of forming TiN spacers.

17. The method of claim 16, wherein the disposable sidewall spacers consist of silicon nitride or silicon dioxide.

18. The method of claim 17, further comprising removing the disposable spacers prior to the step of forming TiN sidewall spacers.

* * * * *